(12) United States Patent
Yang et al.

(10) Patent No.: US 7,166,917 B2
(45) Date of Patent: Jan. 23, 2007

(54) SEMICONDUCTOR PACKAGE HAVING PASSIVE COMPONENT DISPOSED BETWEEN SEMICONDUCTOR DEVICE AND SUBSTRATE

(75) Inventors: Jun Young Yang, Kaohsiung (TW); You Ock Joo, Kaohsiung (TW); Dong Pil Jung, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 46 days.

(21) Appl. No.: 11/028,757

(22) Filed: Jan. 5, 2005

(65) Prior Publication Data

US 2006/0145339 A1    Jul. 6, 2006

(51) Int. Cl.
*H01L 23/34* (2006.01)
*H01L 23/02* (2006.01)
*H01L 23/06* (2006.01)
*H01L 23/04* (2006.01)

(52) U.S. Cl. .............. 257/724; 257/678; 257/680; 257/684; 257/685; 257/686; 257/730

(58) Field of Classification Search ............. 257/678, 257/680, 684, 724, 685–686, 730
See application file for complete search history.

(56) References Cited

U.S. PATENT DOCUMENTS

| 6,362,964 | B1* | 3/2002 | Dubhashi et al. ........... 361/707 |
| 6,445,591 | B1* | 9/2002 | Kwong ..................... 361/761 |
| 6,781,222 | B2  | 8/2004 | Wu et al. .................. 257/684 |
| 6,903,452 | B2* | 6/2005 | Ma et al. ................... 257/680 |
| 6,963,135 | B2* | 11/2005| Chiang et al. ............. 257/723 |
| 6,998,721 | B2* | 2/2006 | Zhou ........................ 257/790 |
| 2001/0010398 | A1* | 8/2001 | Farooq et al. ............. 257/724 |
| 2002/0117748 | A1* | 8/2002 | Avery et al. ............... 257/723 |
| 2004/0022038 | A1* | 2/2004 | Figueroa et al. ........... 361/763 |
| 2004/0150082 | A1* | 8/2004 | Kajiwara et al. .......... 257/678 |
| 2005/0156310 | A1* | 7/2005 | Benner et al. ............. 257/712 |
| 2006/0081980 | A1* | 4/2006 | Fernandez ................. 257/723 |

* cited by examiner

*Primary Examiner*—Ida M. Soward
(74) *Attorney, Agent, or Firm*—Pillsbury Winthrop Shaw Pittman LLP

(57) ABSTRACT

A semiconductor package includes a semiconductor device and a passive component mounted and electrically coupled to a substrate. The passive component is disposed within a cavity portion formed on an upper surface of the substrate and the semiconductor device is disposed across the cavity portion of the substrate above the passive component.

18 Claims, 5 Drawing Sheets

SEMICONDUCTOR PACKAGE HAVING PASSIVE COMPONENT DISPOSED BETWEEN SEMICONDUCTOR DEVICE AND SUBSTRATE

BACKGROUND OF THE INVENTION

1. Field of the Invention

The present invention relates to semiconductor packages, and more specifically to semiconductor packages having passive components.

2. Description of the Related Art

A semiconductor package typically includes a circuitized substrate with one or more active devices attached thereon; packages including only one device are known as Single Chip Modules (SCM), while packages including a plurality of devices are called Multi Chip Modules (MCM). The active device is typically a chip, a small piece of a wafer a commonly made of Silicon, Germanium or Gallium Arsenide.

As the speed of electronic packages increase, noise in the DC power and ground lines increasingly becomes a problem. To reduce this noise, passive components such as decoupling capacitors are often used to reduce power supply noise which occurs due to change in potential difference between the ground voltage and the power-supply voltage supplied to the active device. The decoupling capacitors are placed as close to the active device as practical to increase their effectiveness. Typically the decoupling capacitors are connected to power and ground as close as possible to the active device.

Normally, the passive components are surface-mountable devices (SMD's) used in the so-called surface-mounting technique in which the passive components are directly secured to a substrate via two end contacts thereof. However, mounting the passive components directly to the substrate, as in many prior art packages, creates several problems. First, the requirement for the passive components to be disposed at predetermined positions on the substrate restricts the flexibility of substrate routability. Moreover, the area of the substrate increases with an increase in the number of passive components mounted thereon, thereby making the package efficiency unacceptably low.

It could be understood that the semiconductor package of the present invention may include more than one passive component and the passive components may include capacitors, resistors and inductors arranged as filters to suppress power source noises and attain speed-up of the operation of the chip.

SUMMARY OF THE INVENTION

It is therefore an object of the present invention to provide a semiconductor package which overcomes, or at least reduces the above-mentioned problems of the prior art.

A semiconductor package having features of the present invention generally includes a semiconductor device and a passive component mounted and electrically coupled to a substrate. To achieve the above listed and other objects, the passive component is disposed within a cavity portion formed on an upper surface of the substrate and the semiconductor device is disposed across the cavity portion of the substrate above the passive component, thereby significantly reducing overall thickness of the finished package so as to increase the packaging efficiency.

The semiconductor device may be electrically connected to the substrate by a plurality of bonding wires and a package body is provided to encapsulate the first semiconductor device, the bonding wires and the passive component against the upper surface of the substrate. Alternatively, the semiconductor device may be connected to the substrate by a plurality of metal bumps.

The semiconductor device may be securely attached to the substrate by an insulating adhesive layer which also fills the cavity portion of the substrate and encapsulates the passive component such that the semiconductor device is free of contact with the passive component.

According to another aspect of the invention, there is provided another semiconductor package in which no cavity portion is formed on the substrate and the passive component is disposed within a space created between the semiconductor device and the substrate. Note that the semiconductor device and the substrate are separated from each other by a predetermined distance sufficient to keep the semiconductor device free of contact with the passive component.

BRIEF DESCRIPTION OF THE DRAWINGS

These and other features, aspects, and advantages of the present invention will be more fully understood by reading the following detailed description of the preferred embodiment, with reference made to the accompanying drawings as follows.

DETAILED DESCRIPTION OF THE PREFERRED EMBODIMENT

Figure 1:
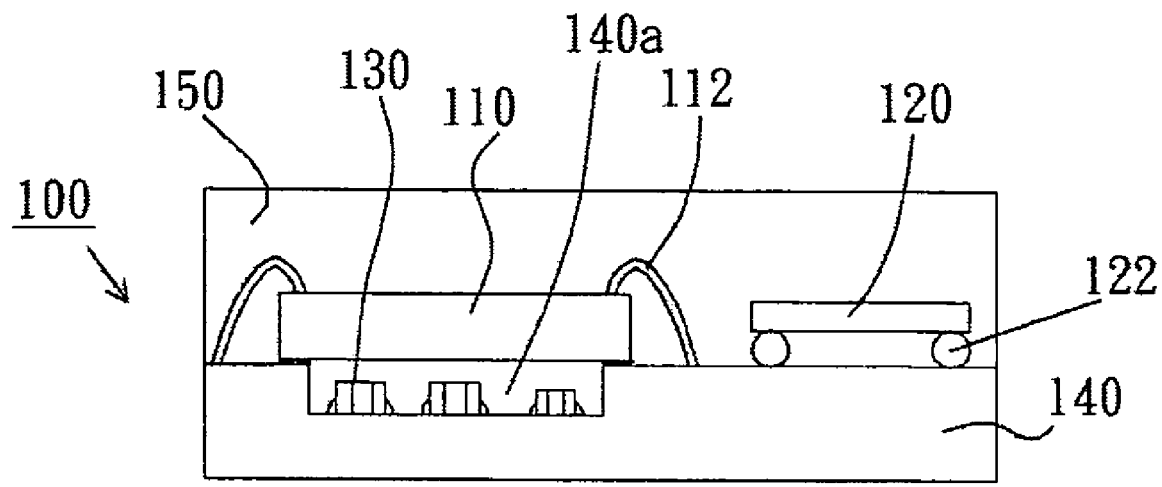
FIG. 1 is a cross sectional view of a semiconductor package according to one embodiment of the present invention.

FIG. 1 shows a semiconductor package 100 according to one embodiment of the present invention. The semiconductor package 100 includes two semiconductor devices 110 and 120, and a plurality of passive components 130 mounted and electrically coupled to a substrate 140. Note that all of the passive components 130 are disposed within a cavity portion 140a formed on an upper surface of the substrate 140 and the semiconductor device 110 is disposed across the cavity portion 140a of the substrate 140 above the passive components 130, thereby significantly reducing overall thickness of the package 100 so as to increase the packaging efficiency.

The semiconductor device 110 is attached to the substrate 140 by means of an adhesive layer or a double-coated adhesive tape. The adhesive layer may be conductive, e.g., a silver-filled epoxy, or non-conductive. The semiconductor device 110 is connected to the substrate 140 by a plurality of bonding wires 112 which act as electrical input/output (I/O) connections to a first set of contacts (not shown), e.g., conductive traces or pads, provided on the upper surface of the substrate 140. The semiconductor device 120 is mechanically and electrically attached to the substrate 140 by a plurality of metal bumps 122 which act as electrical input/output (I/O) connections to a second set of contacts (not shown) provided on the upper surface of the substrate 140. The metal bumps may be gold bumps, solder balls or column-like solder bumps formed on an active surface of the semiconductor device 120 using one of any known bumping procedures.

The upper surface of the substrate 140 is also provided with a third set of contacts (not shown) for electrical coupling to the passive components 130. The third set of contacts may be electrically connected to the first set of contacts through a plurality conductive traces (not shown) which may extend from the bottom surface the cavity portion 140a to the first set of contacts on the upper surface of the substrate 140 directly through the side surfaces of the cavity portion 140a or may extend from the bottom surface the cavity portion 140a to locations below the first set of contacts and connect with the first set of contacts through dedicated vertical terminals (such as vias) provided in the substrate 140.

For making electrical connection to an outside printed circuit board, the lower surface of the substrate is provided with a plurality of pins or a fourth set of contacts (not shown), e.g., conductive traces or pads, and, usually, a plurality of solder balls (not shown) are mounted on the fourth set of contacts of the substrate 140.

As shown in FIG. 1, the semiconductor devices 110 and 120, the bonding wires 112, the metal bumps and the passive component 130 are encapsulated in a package body 150 (not shown). Typically, the package body 150 is formed by known plastic molding methods such as transfer molding.

Figure 2:
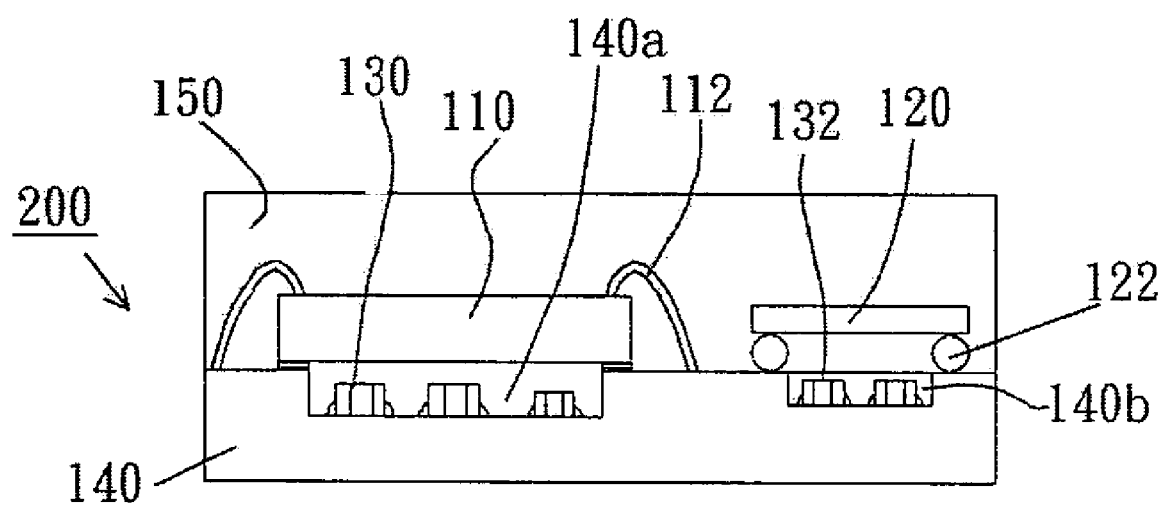
FIG. 2 is a cross sectional view of a semiconductor package according to another embodiment of the present invention.

FIG. 2 shows a semiconductor package 200 according to another embodiment of the present invention. The semiconductor package 200 is a modified construction similar to the semiconductor package 100 shown in FIG. 1, and accordingly, the components of FIG. 2 have been given the same reference numerals as used in FIG. 1. The only difference in the semiconductor package 200 is that there is provided other passive components 132 disposed within a cavity portion 140b formed on the substrate 140, and the semiconductor device 120 is disposed across the cavity portion 140b of the substrate 140 above the passive components 132.

Figure 3:
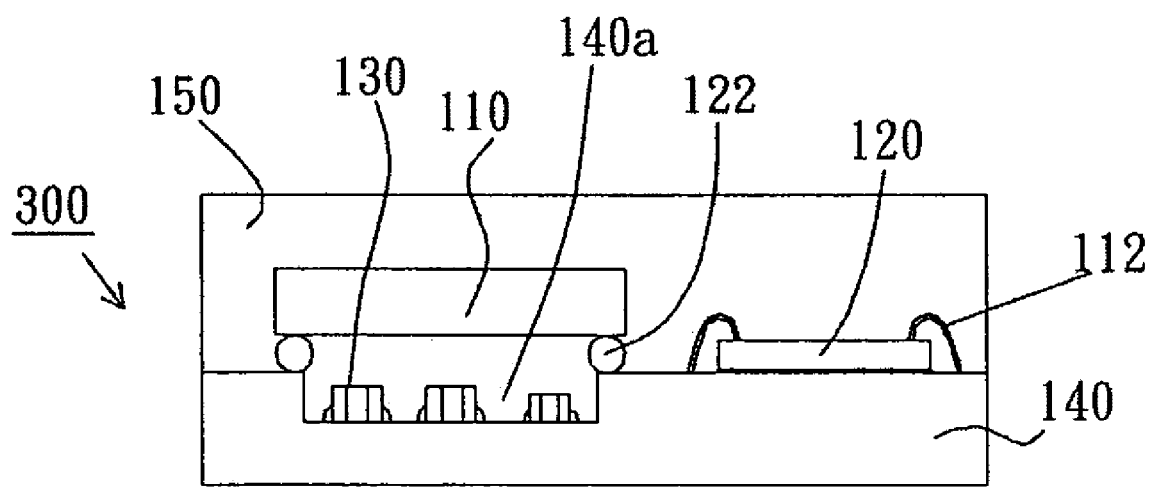
FIG. 3 is a cross sectional view of a semiconductor package according to another embodiment of the present invention.

FIG. 3 shows a semiconductor package 300 according to another embodiment of the present invention. The semiconductor package 300 is substantially identical to the semiconductor package 100 of FIG. 1 with exception that the semiconductor device 110 is connected to the substrate 140 by flip-chip bonding instead of wire-bonding, and the semiconductor device 120 is connected to the substrate 140 by wire-bonding instead of flip-chip bonding.

Figure 4:
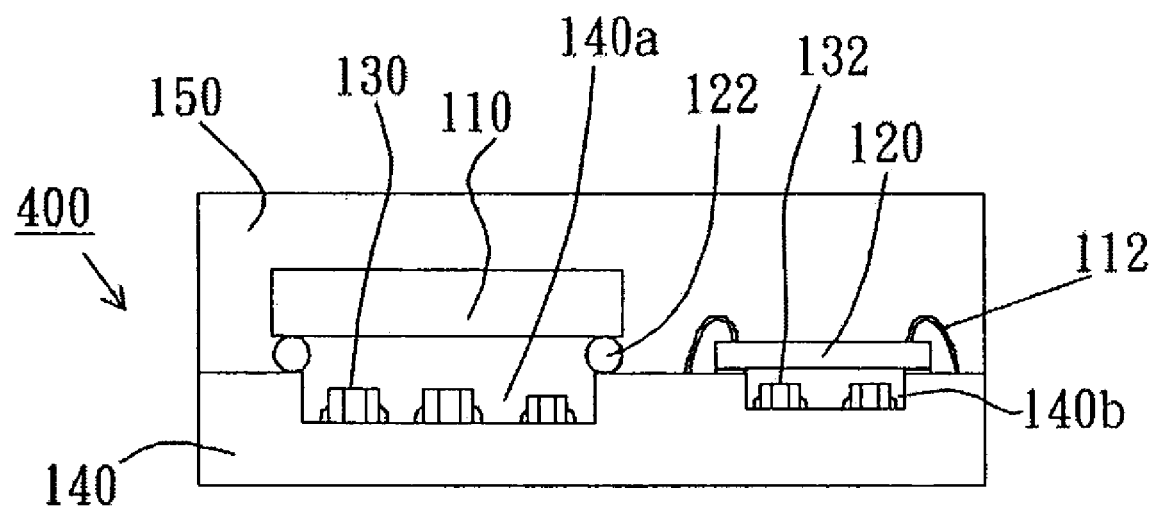
FIG. 4 is a cross sectional view of a semiconductor package according to another embodiment of the present invention.

FIG. 4 shows a semiconductor package 400 according to another embodiment of the present invention. The semiconductor package 400 is substantially identical to the semiconductor package 300 of FIG. 3 with exception that there is provided other passive components 132 disposed within a cavity portion 140b formed on the substrate 140, and the semiconductor device 120 is disposed across the cavity portion 140b of the substrate 140 above the passive components 132.

Figure 5:
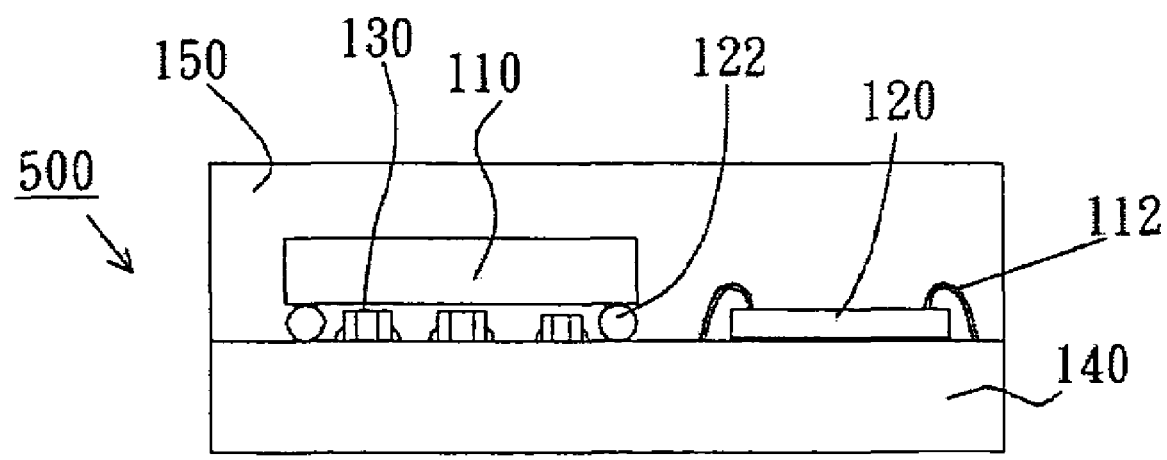
FIG. 5 is a cross sectional view of a semiconductor package according to another embodiment of the present invention.

FIG. 5 shows a semiconductor package 500 according to another embodiment of the present invention. The semiconductor package 500 is substantially identical to the semiconductor package 300 of FIG. 3 with exception that no cavity portion is formed on the substrate 140 and the passive components 130 is disposed within a space created between the semiconductor device 110 and the upper surface of the substrate 140. Note that the semiconductor device 110 and the substrate 140 are separated from each other by a predetermined distance sufficient to keep the semiconductor device 110 free of contact with the passive components 130.

Figure 6:
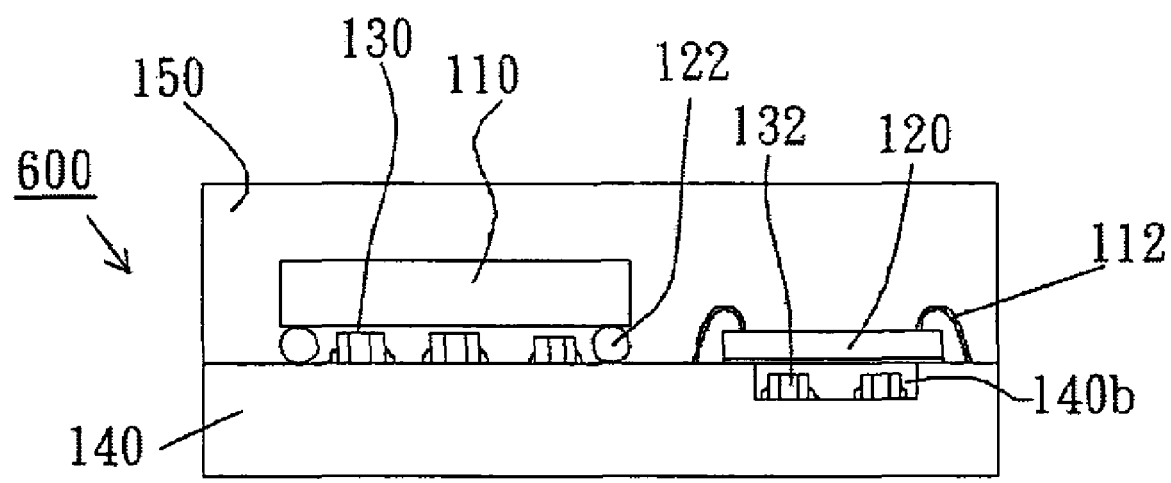
FIG. 6 is a cross sectional view of a semiconductor package according to another embodiment of the present invention.

FIG. 6 shows a semiconductor package 600 according to another embodiment of the present invention. The semiconductor package 600 is substantially identical to the semiconductor package 500 of FIG. 5 with exception that there is provided other passive components 132 disposed within a cavity portion 140b formed on the substrate 140, and the semiconductor device 120 is disposed across the cavity portion 140b of the substrate 140 above the passive components 132.

Figure 7:
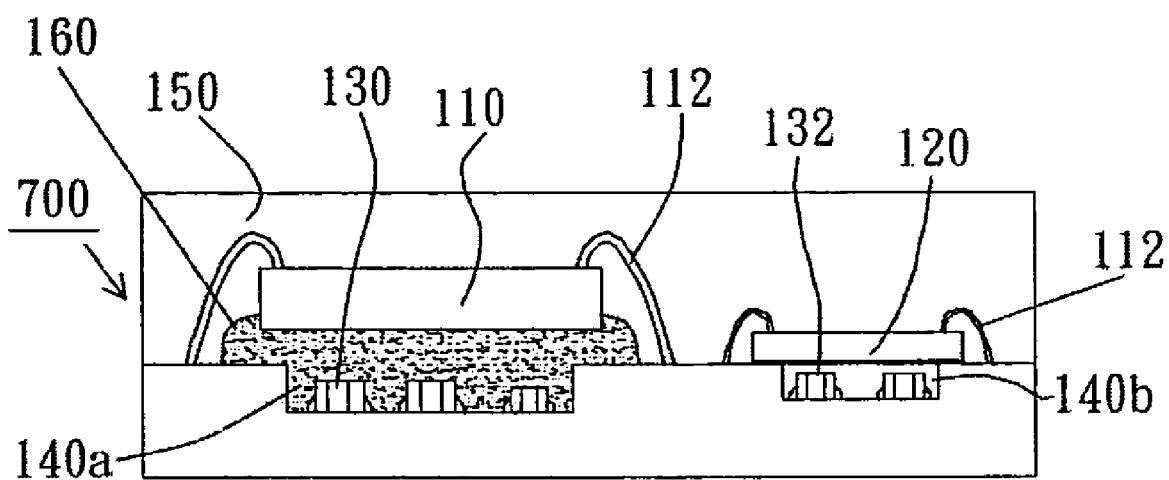
FIG. 7 is a cross sectional view of a semiconductor package according to another embodiment of the present invention.

FIG. 7 shows a semiconductor package 700 according to another embodiment of the present invention. The semiconductor package 700 is substantially identical to the semiconductor package 200 of FIG. 2 with exception that the semiconductor device 120 is connected to the substrate 140 by wire-bonding instead of flip-chip bonding, and the semiconductor device 110 is securely attached to the substrate 140 by an insulating adhesive layer 160 which also fills the cavity portion 140a of the substrate 140 and encapsulates the passive components 130 such that the semiconductor device 110 is free of contact with the passive components 130.

Figure 8:
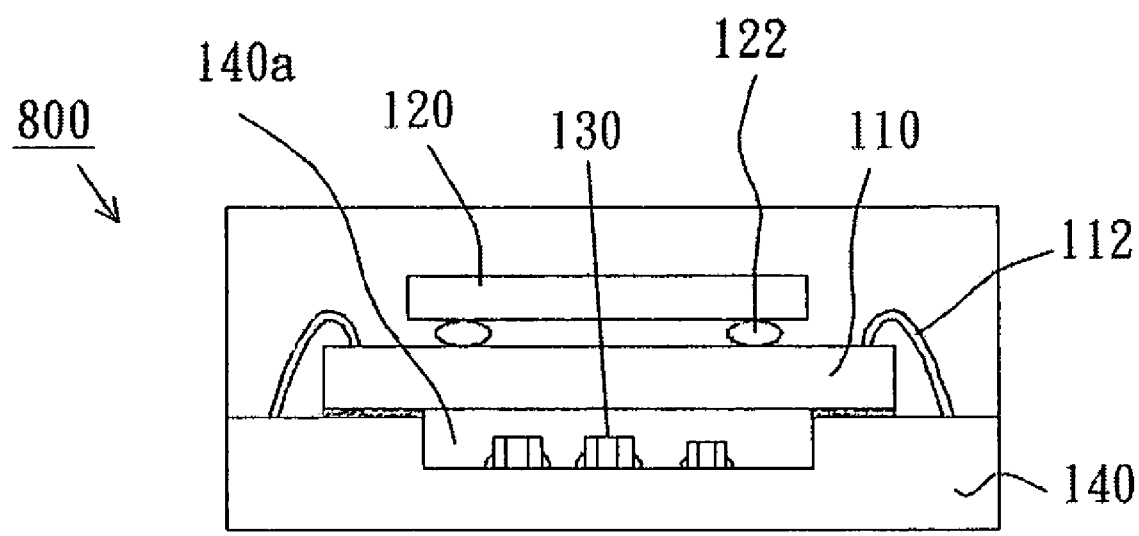
FIG. 8 is a cross sectional view of a semiconductor package according to another embodiment of the present invention.

FIG. 8 shows a semiconductor package 800 according to another embodiment of the present invention. In the semiconductor package 800, the semiconductor device 110 is connected to the substrate 140 by the bonding wires 112, and the semiconductor device 120 is stacked on the semiconductor device 110. The bonding wires 112 are respectively connected between the bonding pads (not shown) of the semiconductor device 110 and the first set of contacts (not shown) of the substrate 140. Typically, the semiconductor device 110 is provided with a passivation layer (not shown) covering top edge portions of each of the boning pads, leaving the central surface portion of each of the boning pads exposed. The passivation layer may be a polyimide layer, a silicon dioxide layer, a silicon nitride layer, or layers of other passivation materials known to those having skill in the art. In this embodiment, the active surface of the semiconductor device 110 is provided with a plurality of traces (not shown) adapted for coupling to the semiconductor device 120. Each trace has a first end portion connected to one of the bonding pads on the semiconductor device 110 and a second end portion connected to one of the bonding pads on the semiconductor device 120 via one metal bump 122. Note that all of the passive components 130 are disposed within a cavity portion 140a formed on an upper surface of the substrate 140 and the semiconductor device 110 is disposed across the cavity portion 140a of the substrate 140 above the passive components 130, thereby significantly reducing overall thickness of the package 100 so as to increase the packaging efficiency. The second semiconductor device 120 may include integrated passive circuit elements.

Figure 9:
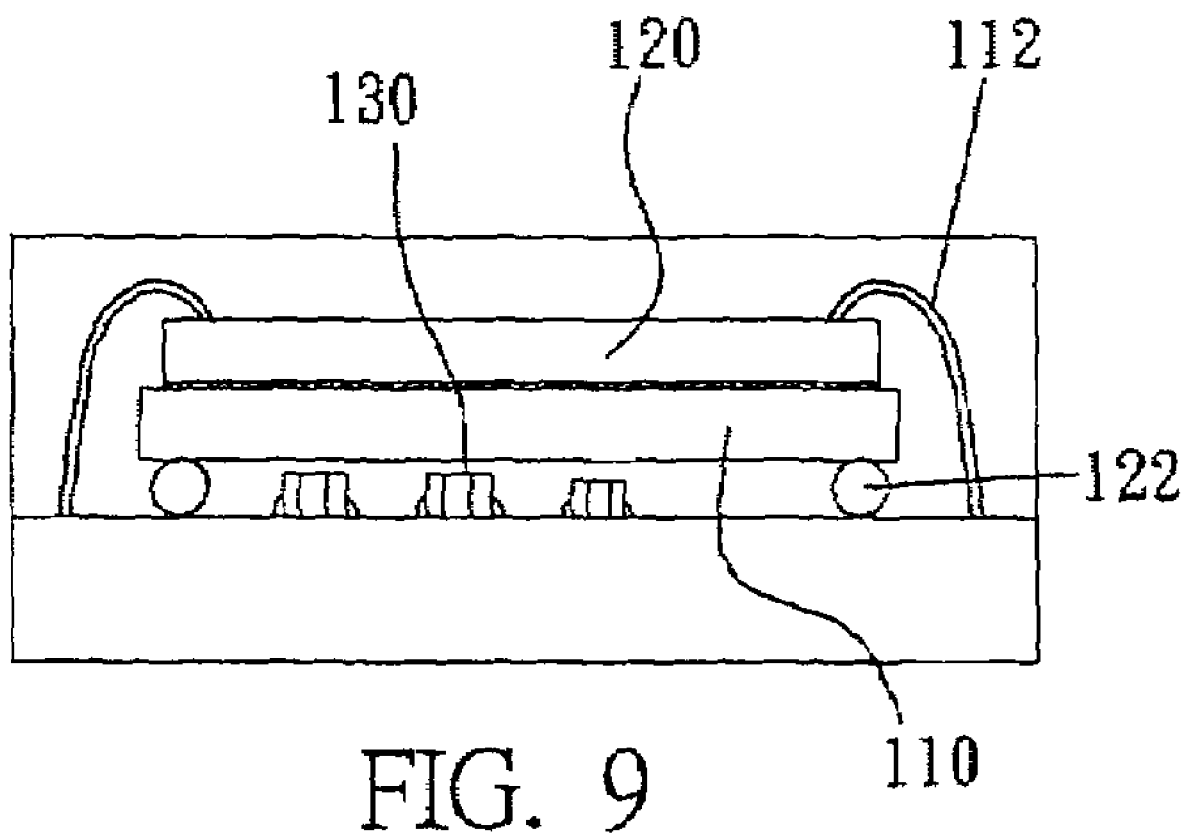
FIG. 9 is a cross sectional view of a semiconductor package according to another embodiment of the present invention.

FIG. 9 shows a semiconductor package 900 according to another embodiment of the present invention. In the semiconductor package 900, the semiconductor device 110 is mechanically and electrically attached to the substrate 140 by a plurality of metal bumps 122, and the semiconductor device 120 is stacked on the semiconductor device 110 and connected to the substrate 140 by a plurality of bonding wires 112. In this embodiment, no cavity portion is formed on the substrate 140 and the passive components 130 is disposed within a space created between the semiconductor device 110 and the upper surface of the substrate 140. Note that the semiconductor device 110 and the substrate 140 are separated from each other by a predetermined distance sufficient to keep the semiconductor device 110 free of contact with the passive components 130. The second semiconductor device 120 may include integrated passive circuit elements.

According to the present invention, all of the passive components are disposed right below at least one semiconductor device whereby the surface-mountable device can be placed as close as possible to the active device. This will greatly reduce the length of the conductive traces required in substrate for connecting the passive components and the corresponding semiconductor device thereby enhancing electrical performance (because the impedance, the inductance, and the noise of the conductive traces are in proportion to the length of the conductive traces). Furthermore, since all of the passive components are disposed right below at least one semiconductor device, the present invention has advantages over the prior art of mounting passive components on a substrate at locations around the semiconductor devices in that the amount of board real estate required is greatly reduced thereby increasing the package efficiency.

Although the invention has been explained in relation to its preferred embodiments, it is to be understood that many other possible modifications and variations can be made without departing from the spirit and scope of the invention as hereinafter claimed. For example, although the present invention is discussed in detail with respect to semiconductor package including two semiconductor devices, the present invention is applicable to a semiconductor package including only one semiconductor device.

What is claimed is:

1. A semiconductor package, comprising:
   a substrate having a first cavity portion formed on an upper surface thereof;
   at least one first passive component mounted and electrically coupled to the substrate, the at least one first passive component being disposed within the first cavity portion of the substrate;
   a first semiconductor device mounted and electrically coupled to the substrate, the first semiconductor device being disposed across the first cavity portion of the substrate above the at least one first passive; and
   a plurality of bonding wires for electrically connecting the first semiconductor device to the substrate and a package body encapsulating the first semiconductor device, the bonding wires and the first passive component against the upper surface of the substrate.

2. The semiconductor package as claimed in claim 1, wherein the first semiconductor device is free of contact with the at least one first passive component.

3. The semiconductor package as claimed in claim 1, further comprising an insulating adhesive layer provided between the first semiconductor device and the substrate for securely attaching the first semiconductor device to the substrate and encapsulating the at least one first passive component.

4. A semiconductor package, comprising:
   a substrate having a first cavity portion formed on an upper surface thereof;
   at least one first passive component mounted and electrically coupled to the substrate, the at least one first passive component being disposed within the first cavity portion of the substrate;
   a first semiconductor device mounted and electrically coupled to the substrate, the first semiconductor device being disposed across the first cavity portion of the substrate above the at least one first passive component; and
   a second semiconductor device stacked on the first semiconductor device and a plurality of metal bumps for mechanically and electrically attaching the second semiconductor device to the first semiconductor device.

5. The semiconductor package as claimed in claim 4, wherein the second semiconductor device includes a plurality of integrated passive circuit elements.

6. A semiconductor package, comprising:
   a substrate having a first cavity portion formed on an upper surface thereof;
   at least one first passive component mounted and electrically coupled to the substrate, the at least one first passive component being disposed within the first cavity portion of the substrate;
   a first semiconductor device mounted and electrically coupled to the substrate, the first semiconductor device being disposed across the first cavity portion of the substrate above the at least one first passive component; and
   a second semiconductor device stacked on the first semiconductor device and wire-bonded to the substrate.

7. The semiconductor package as claimed in claim 6, wherein the second semiconductor device includes a plurality of integrated passive circuit elements.

8. A semiconductor package, comprising:
   a substrate having a first cavity portion formed on an upper surface thereof;
   at least one first passive component mounted and electrically coupled to the substrate, the at least one first passive component being disposed within the first cavity portion of the substrate;
   a first semiconductor device mounted and electrically coupled to the substrate, the first semiconductor device being disposed across the first cavity portion of the substrate above the at least one first passive component;
   the substrate having a second cavity portion formed on the upper surface thereof;
   at least one second passive component disposed within the second cavity portion of the substrate; and
   a second semiconductor device disposed across the second cavity portion of the substrate above the at least one second passive component.

9. The semiconductor package as claimed in claim 1, further comprising a plurality of conductive traces provided on the substrate for electrically connecting the at least one first passive component and the first semiconductor device.

10. The semiconductor package as claimed in claim 9, wherein the first semiconductor device is electrically connected to a set of contacts on the upper surface of the substrate, and the conductive traces extend from the bottom surface the cavity portion to the set of contacts through the side surfaces of the cavity portion.

11. The semiconductor package as claimed in claim 9, wherein the first semiconductor device is electrically connected to a set of contacts on the upper surface of the substrate, and the conductive traces extend from the bottom surface the cavity portion to locations below the contacts and connect with the contacts through a plurality of dedicated vertical terminals provided in the substrate.

12. A semiconductor package, comprising:
a substrate;
a first semiconductor device;
a plurality of metal bumps for mechanically and electrically attaching the first semiconductor device to the substrate;
a second semiconductor device stacked on the first semiconductor device; and
at least one first passive component mounted and electrically coupled to the substrate, the at least one passive component being disposed between the first semiconductor device and the substrate,
wherein the first semiconductor device and the substrate are separated from each other by a predetermined distance sufficient to keep the first semiconductor device free of contact with the at least one passive component.

13. A semiconductor package, comprising:
a substrate;
a first semiconductor device;
a plurality of metal bumps for mechanically and electrically attaching the first semiconductor device to the substrate;
at least one first passive component mounted and electrically coupled to the substrate, the at least one passive component being disposed between the first semiconductor device and the substrate,
wherein the first semiconductor device and the substrate are separated from each other by a predetermined distance sufficient to keep the first semiconductor device free of contact with the at least one passive component,
wherein the substrate has a cavity portion formed on an upper surface thereof, and the semiconductor package further comprises at least one second passive component disposed within the cavity portion of the substrate and a second semiconductor device disposed across the cavity portion of the substrate above the at least one second passive component.

14. The semiconductor package as claimed in claim 12, wherein the second semiconductor device is wire-bonded to the substrate.

15. The semiconductor package as claimed in claim 14, wherein the second semiconductor device includes a plurality of integrated passive circuit elements.

16. The semiconductor package as claimed in claim 12, further comprising a plurality of metal bumps for mechanically and electrically attaching the second semiconductor device to the first semiconductor device.

17. The semiconductor package as claimed in claim 16, wherein the second semiconductor device includes a plurality of integrated passive circuit elements.

18. The semiconductor package as claimed in claim 12, further comprising a plurality of conductive traces provided on the substrate for electrically connecting the at least one first passive component and the first semiconductor device.

* * * * *